(12) United States Patent
So et al.

(10) Patent No.: US 11,087,980 B2
(45) Date of Patent: Aug. 10, 2021

(54) LASER CRYSTALLIZATION DEVICE

(71) Applicant: SAMSUNG DISPLAY CO., LTD., Yongin-si (KR)

(72) Inventors: Byung Soo So, Yongin-si (KR); Mee Jae Kang, Suwon-si (KR); Ho Seok Lee, Suwon-si (KR); Jae Gyun Lim, Osan-si (KR); Sang Ho Jeon, Yongin-si (KR); Yeon Hee Jeon, Incheon (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 963 days.

(21) Appl. No.: 15/466,330

(22) Filed: Mar. 22, 2017

(65) Prior Publication Data
US 2017/0358449 A1     Dec. 14, 2017

(30) Foreign Application Priority Data

Jun. 14, 2016     (KR) ........................ 10-2016-0073882

(51) Int. Cl.
*H01L 21/02*     (2006.01)
*H01S 3/034*     (2006.01)
(Continued)

(52) U.S. Cl.
CPC .. *H01L 21/02675* (2013.01); *H01L 21/67115* (2013.01); *H01L 27/1274* (2013.01);
(Continued)

(58) Field of Classification Search
CPC ......... H01L 21/02; H01L 27/12; H01L 21/67; H01L 21/02675; H01S 3/03; H01S 3/09;
(Continued)

(56) References Cited

U.S. PATENT DOCUMENTS 3,624,531 A * 11/1971 Norris, Jr. ................ H01S 3/11
372/93
5,091,913 A     2/1992 Zhang et al.
(Continued)

FOREIGN PATENT DOCUMENTS

JP     63-209187     8/1988
JP     06-060161 U   8/1994
(Continued)

OTHER PUBLICATIONS

Extended European Search Report for Application No. 17175915.2 dated Oct. 20, 2017.

*Primary Examiner* — Erin E McGrath
(74) *Attorney, Agent, or Firm* — F. Chau & Associates, LLC

(57) ABSTRACT

A laser crystallization method includes exciting gas medium in an airtight container to generate laser beams; amplifying the laser beams by reflecting the laser beams between a high reflection mirror and a low reflection mirror respectively disposed facing opposite end portions of the airtight container, wherein a first transparent window and a second transparent window are fixed to respective end portions of the airtight container, and outputting the amplified laser beams; and disposing a cleaning mirror in a path of the laser beams that have propagated through the second transparent window.

19 Claims, 16 Drawing Sheets

(51) Int. Cl.

| | |
|---|---|
| *H01L 21/67* | (2006.01) |
| *H01L 27/12* | (2006.01) |
| *H01S 3/00* | (2006.01) |
| *H01S 3/03* | (2006.01) |
| *H01S 3/038* | (2006.01) |
| *H01S 3/0971* | (2006.01) |
| *H01S 3/225* | (2006.01) |
| *H01S 3/04* | (2006.01) |
| *H01S 3/041* | (2006.01) |

(52) U.S. Cl.
CPC ............... *H01S 3/005* (2013.01); *H01S 3/03* (2013.01); *H01S 3/038* (2013.01); *H01S 3/0346* (2013.01); *H01S 3/0971* (2013.01); *H01S 3/225* (2013.01); *H01S 3/041* (2013.01); *H01S 3/0407* (2013.01)

(58) Field of Classification Search
CPC ... H01S 3/22; H01S 3/00; H01S 3/034; H01S 3/086
See application file for complete search history.

(56) References Cited

U.S. PATENT DOCUMENTS

| | | | |
|---|---|---|---|
| 5,805,625 A * | 9/1998 | Langner | H01S 3/025 372/35 |
| 6,563,653 B2 | 5/2003 | Heist et al. | |
| 6,970,492 B2 | 11/2005 | Govorkov et al. | |
| 2003/0086182 A1* | 5/2003 | Tanaka | B23K 26/0736 359/719 |
| 2003/0210715 A1* | 11/2003 | Lokai | H01S 3/1392 372/20 |
| 2004/0057489 A1* | 3/2004 | Fallon | H01S 3/2333 372/57 |
| 2005/0041697 A1* | 2/2005 | Seifert | B23K 26/0096 372/6 |
| 2006/0001990 A1* | 1/2006 | Andreasch | G02B 26/105 359/876 |
| 2006/0044981 A1* | 3/2006 | Egawa | B23K 26/14 369/53.24 |
| 2008/0037609 A1* | 2/2008 | Nagai | H01S 3/034 372/57 |
| 2013/0107899 A1* | 5/2013 | Matsunaga | H01S 3/0818 372/20 |

FOREIGN PATENT DOCUMENTS

| | | |
|---|---|---|
| JP | 06-237034 | 8/1994 |
| JP | 2006-344908 | 12/2006 |
| KR | 10-2004-0066308 | 7/2004 |
| KR | 10-1164063 | 7/2012 |

* cited by examiner

LASER CRYSTALLIZATION DEVICE

CROSS REFERENCE TO RELATED APPLICATIONS

This application claims priority under 35 USC § 119 from, and the benefit of, Korean Patent Application No. 10-2016-0073882, filed in the Korean Intellectual Property Office on Jun. 14, 2016, the contents of which are herein incorporated by reference in their entirety.

BACKGROUND

1. Technical Field

Embodiments of the present disclosure are generally directed to a laser crystallization method. More particularly, embodiments of the present disclosure are generally directed to a laser crystallization method that crystallizes amorphous silicon into polycrystalline silicon.

2. Discussion of the Related Art

Pixels of active matrix type display devices such as an organic light emitting devices (OLED) or a liquid crystal displays (LCD) comprise thin film transistors (TFTs) that include semiconductor layers. A semiconductor layer is typically made of polycrystalline silicon. Polycrystalline silicon has high mobility and is appropriate for organic light emitting devices to control brightness of emission layers based on current.

Polycrystalline silicon can be generated by irradiating laser beams onto amorphous silicon and performing an annealing process thereto, during which a laser crystallization device is used. The laser crystallization device may be a gas laser device, such as an excimer laser device. A laser crystallization device excites a gas medium by an electric discharge process to generate laser beams, amplifies the laser beams by resonance, and outputs the resultant laser beams.

SUMMARY

Embodiments of the present disclosure can provide a laser crystallization method that reduces component contamination and increases a replacement period.

An exemplary embodiment provides a laser crystallization method that includes exciting a gas medium in an airtight container to generate laser beams; amplifying the laser beams by reflecting the laser beams between a high reflection mirror and a low reflection mirror respectively disposed facing opposite end portions of the airtight container, wherein a first transparent window and a second transparent window fixed to respective end portions of the airtight container, and outputting the amplified laser beams; and disposing a cleaning mirror in a path of the laser beams that have propagated through the second transparent window.

Outputting the amplified laser beams may define a running state for in which the laser beams are irradiated to an irradiation target, and disposing the cleaning mirror may define an idle state of waiting for a next execution.

The cleaning mirror may be moved away from the path of laser beams during the outputting of amplified laser beams. The cleaning mirror may be combined with a transferor that displaces the cleaning mirror between a first position in the path of the laser beams and a second position away from and out of the path of the laser beams.

The transferor may include a driving motor and a mirror frame that is rotated by the driving motor and that fixes the cleaning mirror. The cleaning mirror may be displaced between the first position and the second position by rotation of the mirror frame.

The transferor may include a driving motor, and a mirror frame that is linearly displaced by the driving motor and that fixes the cleaning mirror. The cleaning mirror may be displaced between the first position and the second position by linear motion of the mirror frame.

The low reflection mirror and the cleaning mirror may be combined with the transferor which exchanges positions thereof between outputting the amplified laser beams and disposing the cleaning mirror. The transferor may include a driving motor and a mirror frame that is rotated by the driving motor and that fixes the low reflection mirror and the cleaning mirror. The positions of the low reflection mirror and the cleaning mirror may be exchanged by rotating the mirror frame.

The low reflection mirror and the cleaning mirror may be combined with the transferor, and the low reflection mirror may be moved away from the path of the laser beams when disposing the cleaning mirror. The transferor may include a driving motor and a mirror frame that is linearly displaced by the driving motor and that fixes the low reflection mirror and the cleaning mirror. One of the low reflection mirror and the cleaning mirror may be disposed to face the second transparent window by a linear displacement of the mirror frame.

Another exemplary embodiment provides a laser crystallization device that includes an airtight container that is a gas laser device charged with a gas medium, a first transparent window and a second transparent window fixed to respective end portions of the airtight container that face each other along the center axis of the airtight container, a high reflection mirror installed outside the first transparent window and a low reflection mirror installed outside the second transparent window, wherein the low reflection mirror has a reflectivity that is lower than its transmittance, and a cleaning mirror. During a running state, laser beams are output from the airtight container through the second transparent window and the low reflection mirror to an irradiation target, and the cleaning mirror is positioned away from and out of a path of laser beams output from the airtight container. During an idle state, the cleaning mirror is disposed in the path of the laser beams output from the airtight container, wherein the laser beams are reflected back into the airtight container.

The laser crystallization device may further include a shutter that transmits laser beams propagating through the low reflection mirror in the running state, and blocks laser beams propagating through the low reflection mirror in the running state, and blocks in the idle state.

The low reflection mirror and the cleaning mirror may be combined with a transferor, and one of the low reflection mirror and the cleaning mirror may be disposed in the path of the laser beams by operation of the transferor.

The transferor may includes a driving motor and a mirror frame that is rotated by the driving motor and that fixes the low reflection mirror and the cleaning mirror, and the positions of the low reflection mirror and the cleaning mirror are exchanged by rotating the mirror frame.

The transferor may includes a driving motor and a mirror frame that is linearly translated by the driving motor and that fixes the low reflection mirror and the cleaning mirror, and one of the low reflection mirror and the cleaning mirror is disposed to face the second transparent window by linear translation of the mirror frame.

The cleaning mirror may be combined with a transferor that displaces the cleaning mirror between a first position in the path of the laser beams and a second position away from and out of the path of the laser beams. The transferor may includes a driving motor and a mirror frame that is rotated by the driving motor and that fixes the cleaning mirror, and the cleaning mirror is displaced between the first position and the second position by rotation of the mirror frame. The transferor may include a driving motor and a mirror frame that is linearly displaced by the driving motor and that fixes the cleaning mirror, and the cleaning mirror is displaced between the first position and the second position by linear motion of the mirror frame.

The laser beams reflected back into the airtight container may remove contamination material attached to an internal side of the second transparent window.

The laser crystallization device may further include a pair of electrodes symmetrically disposed with respect to a center of the airtight container, a high-voltage power supply connected to one of the pair of electrodes, a reflection mirror that changes a propagation direction of the laser beams; and a condensing lens that condenses the laser beams to the irradiation target. When a voltage is applied to the electrodes, the gas medium is excited to generate laser beams.

According to a present exemplary embodiment, contamination of the second transparent window can be reduced by the cleaning mirror to maintain a high transmittance for a long time frame. Hence, a replacement period of the second transparent window may be increased, and an operational cost of a laser crystallization device may be reduced.

DETAILED DESCRIPTION

Figure 1:
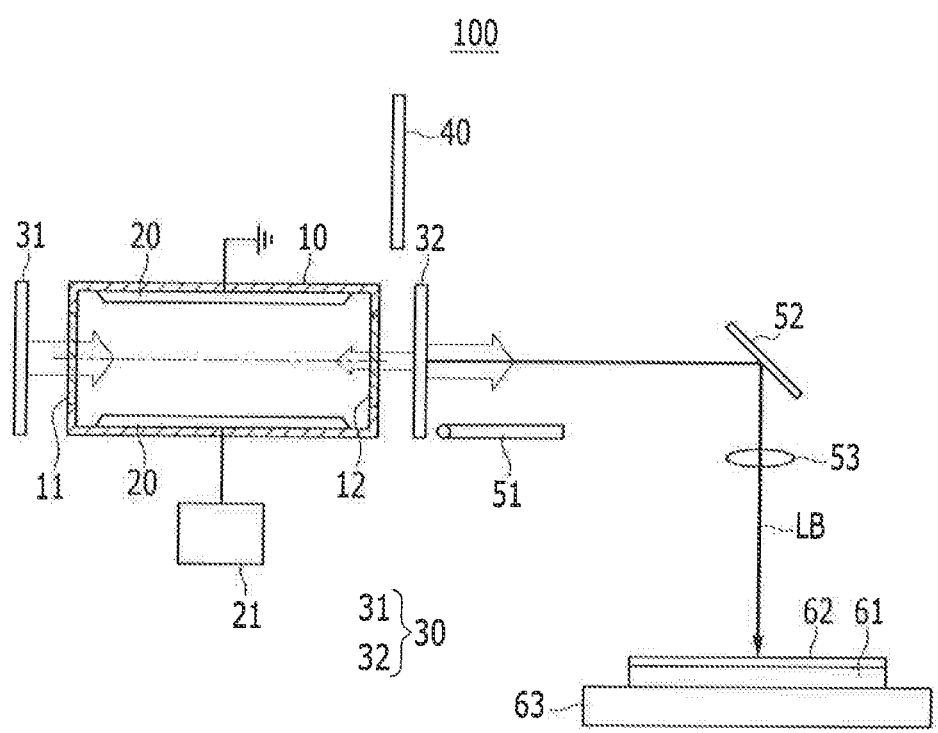
FIG. 1 and FIG. 2 are schematic diagrams of a laser crystallization device according to an exemplary embodiment.

Embodiments of the present disclosure will be described more fully hereinafter with reference to the accompanying drawings, in which exemplary embodiments of the disclosure are shown. As those skilled in the art would realize, exemplary embodiments can be modified in various different ways, all without departing from the spirit or scope of the present disclosure.

When it is said that any part, such as a layer, film, region, or plate, is positioned on another part, it means the part is directly on the other part or above the other part with at least one intermediate part.

The size and thickness of each component shown in the drawings may be arbitrarily shown for understanding and ease of description, but the present disclosure is not limited thereto.

Figure 2:
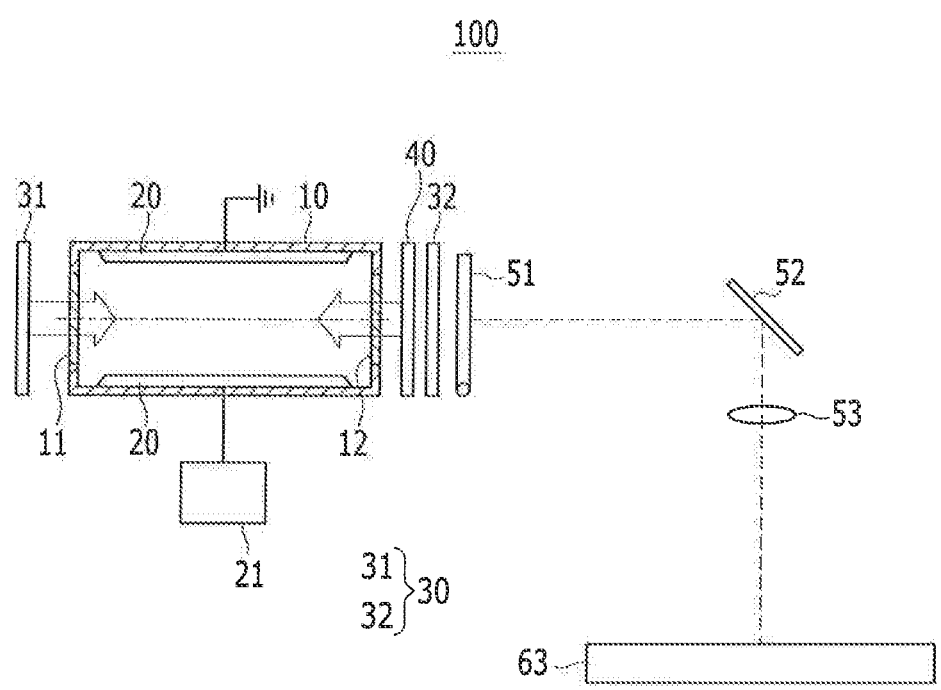

FIG. 1 and FIG. 2 are schematic diagrams of a laser crystallization device according to an exemplary embodiment.

Referring to FIG. 1 and FIG. 2, a laser crystallization device 100 includes an airtight container 10 charged with a gas medium, a pair of electrodes 20 installed in the airtight container 10, a laser resonance portion 30 installed outside the airtight container 10, and a cleaning mirror 40.

According to an embodiment, the laser crystallization device 100 is a gas laser device, such as an excimer laser device, that is a high-power ultraviolet laser device. The word excimer indicates that molecules are stable in the excited state. The gas medium in the airtight container 10 is a mixture gas of a rare gas such as Kr, Ar, and Xe, and hydrogen chloride (HCl).

According to an embodiment, the airtight container 10 has a cylindrical shape, and the pair of electrodes 20 are symmetrically disposed with respect to a center axis (shown with dashed lines) of the airtight container 10. One of the pair of electrodes 20 is grounded and the other thereof is connected to a high-voltage power supply 21. When a voltage is applied to the electrode 20, a discharge occurs between the pair of electrodes 20 and the gas medium is excited to generate the laser beams.

According to an embodiment, a first transparent window 11 and a second transparent window 12 are fixed to respective end portions of the airtight container 10. The first transparent window 11 and the second transparent window 12 face each other along the center axis of the airtight container 10 and transmit the laser beams. The first transparent window 11 and the second transparent window 12 may be made of glass or sapphire, and an anti-reflection coating layer that increases transmittance may be provided on a surface thereof.

According to an embodiment, the laser resonance portion 30 includes a high reflection mirror 31 installed outside the first transparent window 11 and a low reflection mirror 32 installed outside the second transparent window 12. The high reflection mirror 31 has a reflectivity that is close to 100%. The low reflection mirror 32 has a reflectivity that is lower than its transmittance. For example, it may have about 10% reflectivity and about 90% transmittance.

According to an embodiment, the laser beams transmitted through the first transparent window 11 are reflected by the high reflection mirror 31. A portion of the laser beams transmitted through the second transparent window 12 is reflected by the low reflection mirror 32 and the remaining portion thereof is transmitted through the low reflection mirror 32. The laser beams propagate between the high reflection mirror 31 and the low reflection mirror 32 to generate resonance and be amplified. The amplified laser beams propagate through the low reflection mirror 32 and are output to an irradiation target.

According to an embodiment, the laser crystallization device 100 includes a fan motor and a cooling pipe combined with the airtight container 10. The fan motor circulates the gas medium in the airtight container 10, and the cooling pipe cools the gas medium by heat-exchanging the gas medium with cooling water.

Further, according to an embodiment, the laser crystallization device 100 includes a shutter 51, a reflection mirror 52, and a condensing lens 53 installed outside the low reflection mirror 32. The shutter 51 transmits or blocks the laser beams (LB) propagating through the low reflection mirror 32. The reflection mirror 52 changes a propagation direction of the laser beams, and the condensing lens 53 condenses the laser beams to the irradiation target.

According to an embodiment, the irradiation target is an amorphous silicon layer 62 provided on a substrate 61. The amorphous silicon layer 62 is crystallized into a polycrystalline silicon layer by annealing caused by irradiation of laser beams. The substrate 61 and the amorphous silicon layer 62 are fixed to a stage 63, and the stage 63 can move the substrate 61 and the amorphous silicon layer 62 so that the laser beams (LB) can scan the amorphous silicon layer 62.

According to an embodiment, during operation of the laser crystallization device 100, the pair of electrodes 20 can be corroded by arcing discharged from a chlorine component of the gas medium. Hydrogen chloride (HCl) in the gas medium is ionized into hydrogen ions and chlorine ions, and the chlorine ions can corrode the electrode 20. An impurity that includes a corrosive material in the airtight container 10 generally attaches to an internal side of the second transparent window 12.

According to an embodiment, regarding the first transparent window 11, the intensity of laser beams propagating through the first transparent window 11 from inside the airtight container 10 substantially corresponds to the intensity of laser beams propagating through the first transparent window 11 from outside the airtight container 10, that is, reflected by the high reflection mirror 31. Regarding the second transparent window 12, the intensity of laser beams propagating through the second transparent window 12 from inside the airtight container 10 is much greater than the intensity of laser beams propagating through the second transparent window 12 from outside the airtight container 10, that is, reflected by the low reflection mirror 32.

Figure 3:
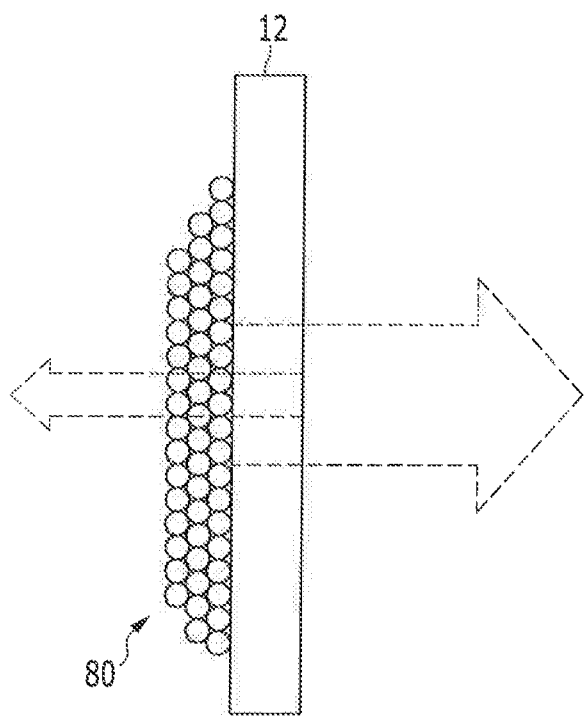
FIG. 3 is an enlarged view of a second transparent window in a laser crystallization device shown in FIG. 1.

FIG. 3 is an enlarged view of the second transparent window 12 in a laser crystallization device shown in FIG. 1.

Referring to FIG. 1 and FIG. 3, according to an embodiment, it is assumed that the intensity of the laser beams propagating through the second transparent window 12 from inside the airtight container 10 is 100%, and the intensity of the laser beams reflected from the low reflection mirror 32 and propagating through the second transparent window 12 is about 10%.

This indicates that the intensity of the laser impact on the second transparent window 12 from inside the airtight container 10 is much greater than the intensity of the laser impact on the second transparent window 12 from outside the airtight container 10. Therefore, it is relatively easier for an impurity 80 to attach to the second transparent window 12 than to the first transparent window 11, and an impurity 80 inside the airtight container 10 is generally absorbed into the second transparent window 12.

Referring to FIG. 1 and FIG. 2, the laser crystallization device 100 alternates between a running state of outputting laser beams to the irradiation target and an idle state that is a standby state of waiting for a next output run. The running state and the idle state may be distinguished by whether an irradiation target is provided on the stage 63.

FIG. 1 shows the laser crystallization device in a running state and FIG. 2 shows the laser crystallization device in an idle state. In a running state, the shutter 51 is moved away from the path of the laser beams (LB) to allow the laser beams (LBs) to propagate, and in the idle state, the shutter 51 is disposed to face the low reflection mirror 32.

It is challenging to turn off a gas laser device, unlike a solid laser device. Therefore, according to an embodiment, a voltage is maintained to the electrode 20 in the idle state so that the laser crystallization device 100 maintains a discharge. In addition, in an idle state, the cleaning mirror 40 is disposed between the second transparent window 12 and the low reflection mirror 32 to reflect the laser beams back through the second transparent window 12. The cleaning mirror 40 is a high reflection mirror with about 100% reflectivity.

Figure 4:
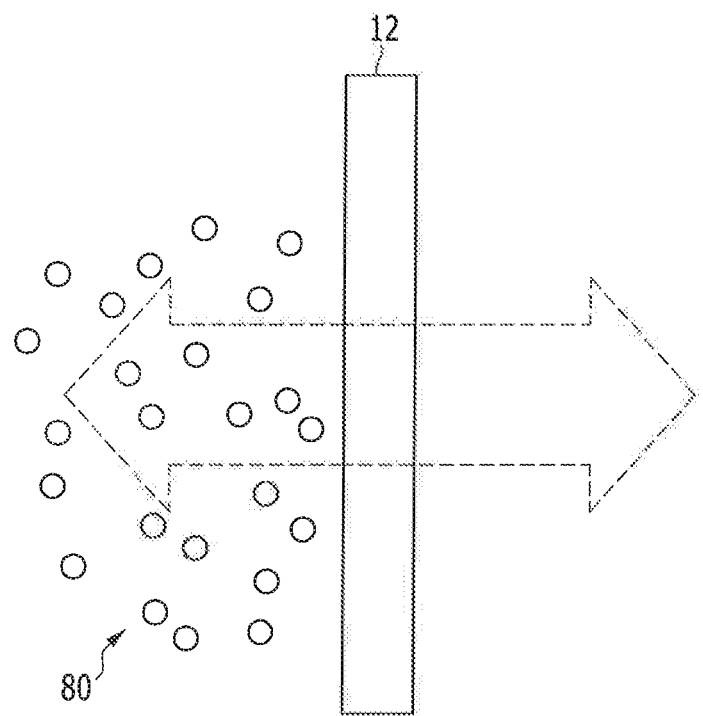
FIG. 4 is an enlarged view of a second transparent window in a laser crystallization device shown in FIG. 2.

FIG. 4 is an enlarged view of the second transparent window 12 in a laser crystallization device shown in FIG. 2.

Referring to FIG. 2 and FIG. 4, according to an embodiment, in an idle state, the cleaning mirror 40 reflects substantially 100% of the laser beams received through the second transparent window 12. Therefore, a laser impact with an intensity that is substantially the same as that of the laser impact on the second transparent window 12 from inside the airtight container 10 is applied to the second transparent window 12 from outside the airtight container 10 to remove the contaminated material 80 on the second transparent window 12.

According to an embodiment, an excimer laser oscillates about every 600th of a second to about a 50th of a second, and a duration of the laser pulse is on the order of nanoseconds (ns). When the cleaning mirror 40 is disposed between the second transparent window 12 and the low reflection mirror 32 and the laser beams are reflected back and forth between the high reflection mirror 31 and the cleaning mirror 40, the beams disperse after being reflected about six to seven times, and there is no substantial change in the laser oscillation mechanism or the laser pulse duration.

According to an embodiment, in an idle state, the cleaning mirror 40 is disposed in the path of laser beams propagating through the second transparent window 12, and in a running state, it is moved away from the path of laser beams. The cleaning mirror 40 may be combined with a transferor that can move the cleaning mirror 40. The transferor may interlock with a device for moving the shutter 51, and in this case, the cleaning mirror 40 and the shutter 51 move simultaneously.

Figure 5:
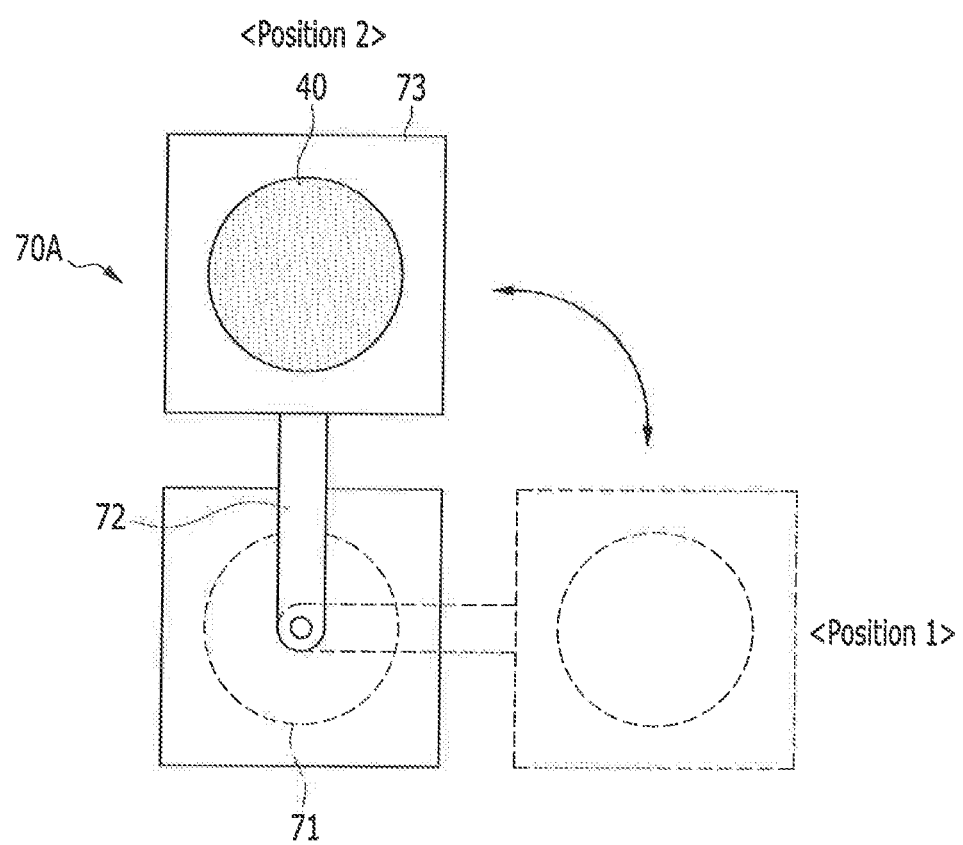
FIG. 5 is a schematic diagram of a cleaning mirror in a laser crystallization device shown in FIG. 1.

FIG. 5 is a schematic diagram of a cleaning mirror in a laser crystallization device shown in FIG. 1.

Referring to FIG. 5, according to an embodiment, a transferor 70A includes a driving motor 71, a rotation bar 72 combined with a rotation shaft of the driving motor 71, and a mirror frame 73 fixed to the rotation bar 72. The cleaning mirror 40 is fixed to the mirror frame 73, and its position is determined by a rotation direction and an angular displacement of the driving motor 71.

According to an embodiment, the cleaning mirror 40 is disposed in the path of the laser beams in an idle state, referred to as a first position, and is moved out of the path of the laser beams in a running state, referred to as a second position. FIG. 5 illustrates a case in which the cleaning mirror 40 rotates by 90° in a clockwise direction to be disposed in the first position in an idle state, and rotates by 90° in a counterclockwise direction to be disposed in the second position in a running state.

Figure 6:
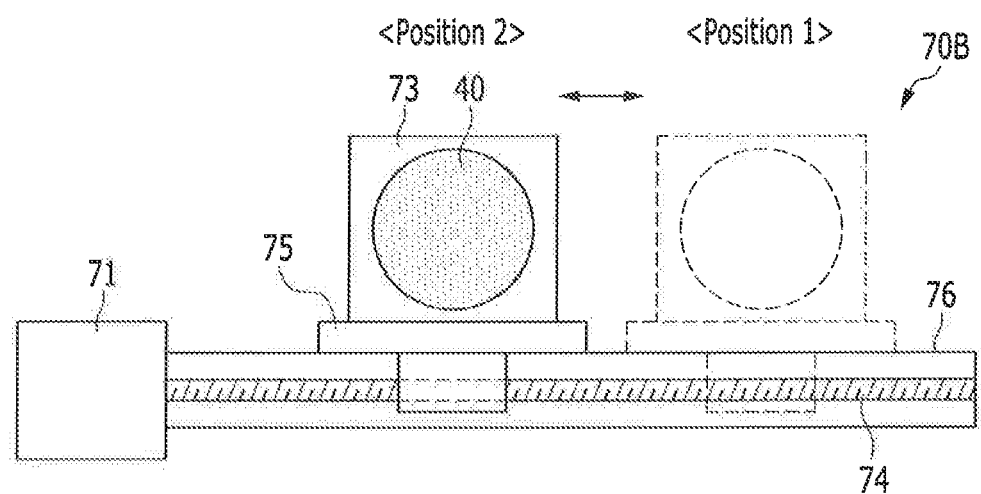
FIG. 6 is a schematic diagram of an exemplary variation of a transferor shown in FIG. 5.

FIG. 6 is a schematic diagram of an exemplary variation of a transferor shown in FIG. 5.

Referring to FIG. 6, according to an embodiment, a transferor 70B includes a driving motor 71 and a linear motion (LM) guide. The LM guide includes a rotation screw 74 combined with the driving motor 71, a slider 75 combined with the rotation screw 74, a mirror frame 73 fixed to the slider 75, and a rail 76 that guides the slider 75. The cleaning mirror 40 is fixed to the mirror frame 73.

According to an embodiment, when the rotation screw 74 is rotated by the driving motor 71, the slider 75 and the mirror frame 73 move on the rail 76 to move the cleaning mirror 40. A displacement direction and a displacement magnitude of the cleaning mirror 40 are determined by the rotation direction and the rotation magnitude of the driving motor 71. The cleaning mirror 40 is disposed in the first position in the path of the laser beams in an idle state, and it is disposed in the second position, away from the path of the laser beams, in a running state.

Figure 7:
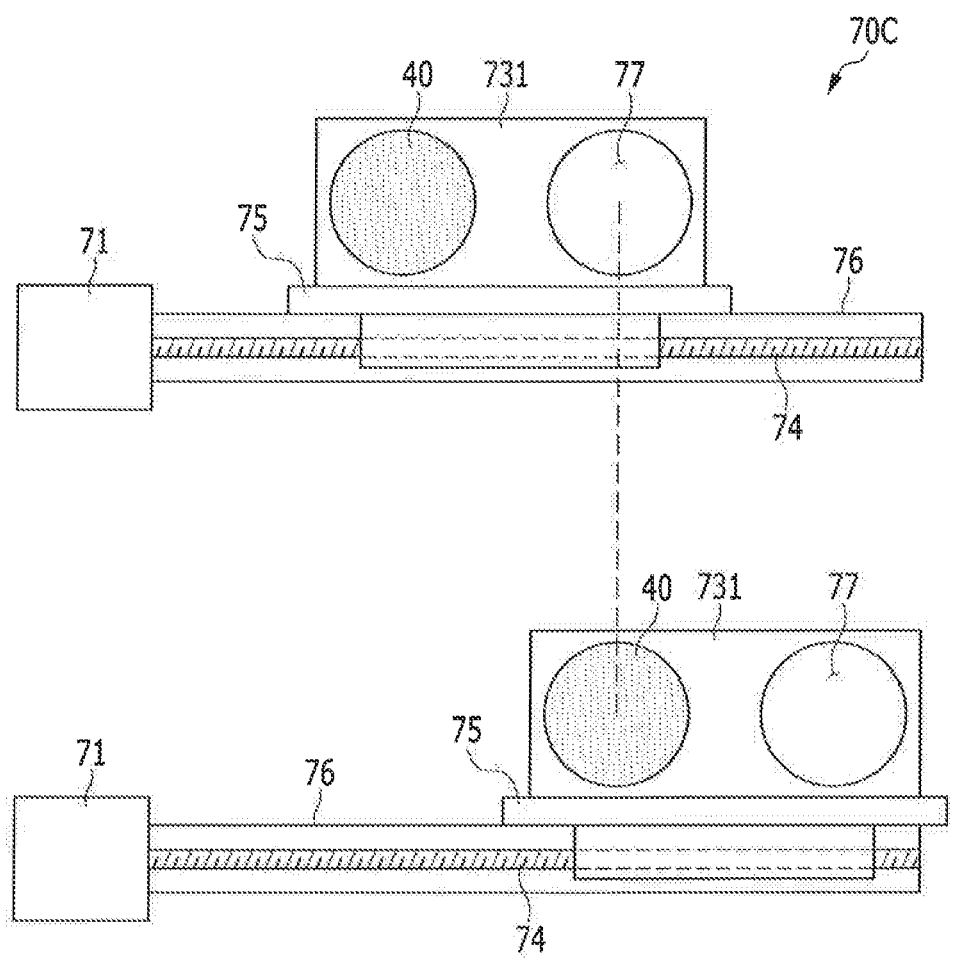
FIG. 7 is a schematic diagram of an exemplary variation of a mirror frame shown in FIG. 6.

FIG. 7 is a schematic diagram of an exemplary variation of a mirror frame shown in FIG. 6.

Referring to FIG. 7, according to an embodiment, a mirror frame 731 of a transferor 70C includes an opening 77 that is displaced from the cleaning mirror 40 in a direction parallel to the rail 76. The opening 77 is disposed in the path of the laser beams in a running state, and the cleaning mirror 40 is displaced by the slider 75 to be disposed in the path of the laser beams in an idle state.

Figure 8:
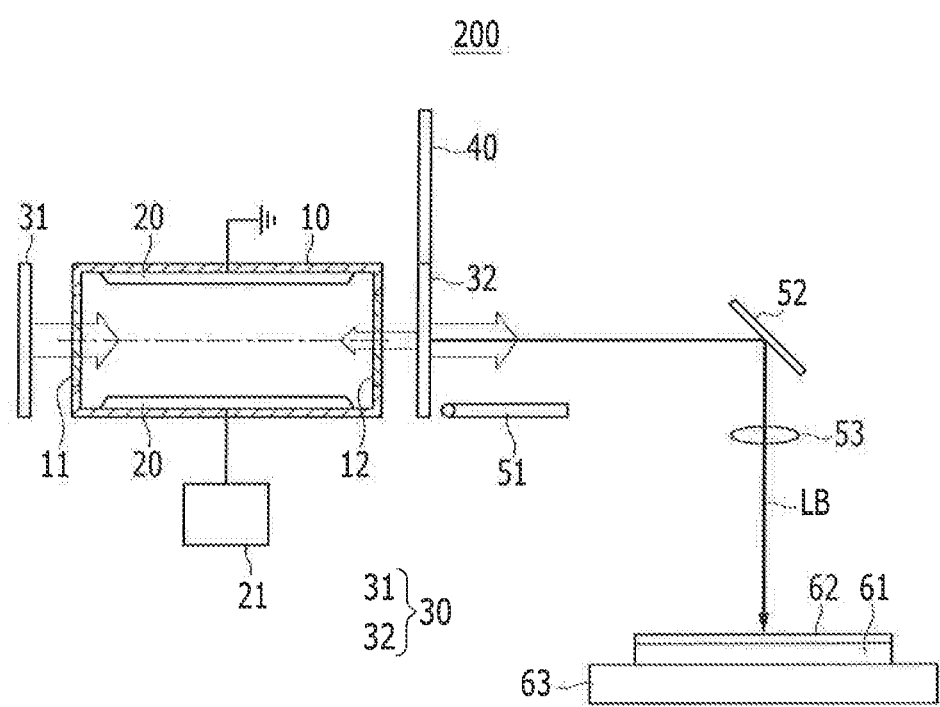
FIG. 8 and FIG. 9 are schematic diagrams of a laser crystallization device according to another exemplary embodiment.
Figure 9:
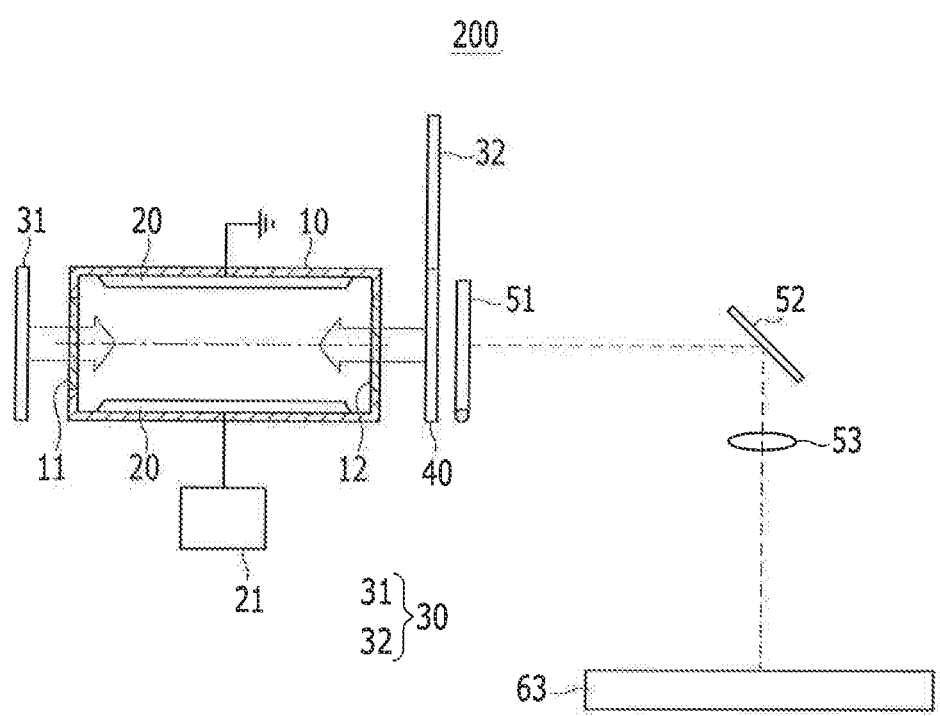
Figure 10A:
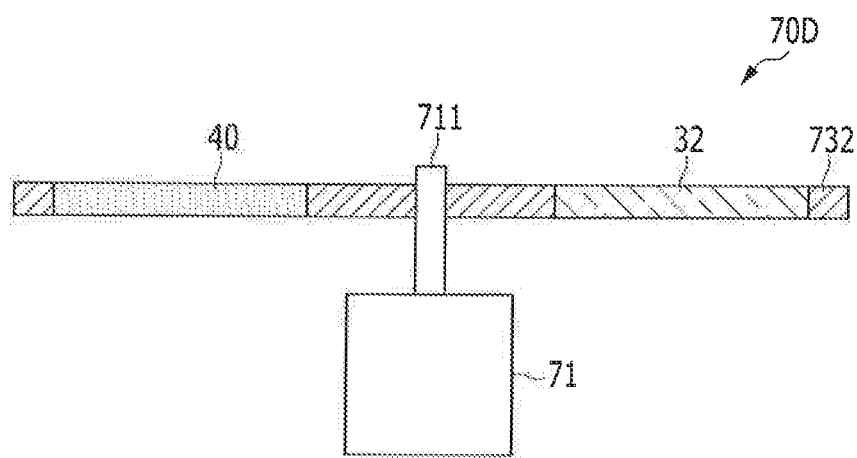
FIG. 10A and FIG. 10B are schematic diagrams of a low reflection mirror and a cleaning mirror shown in FIG. 8 and FIG. 9.
Figure 10B:
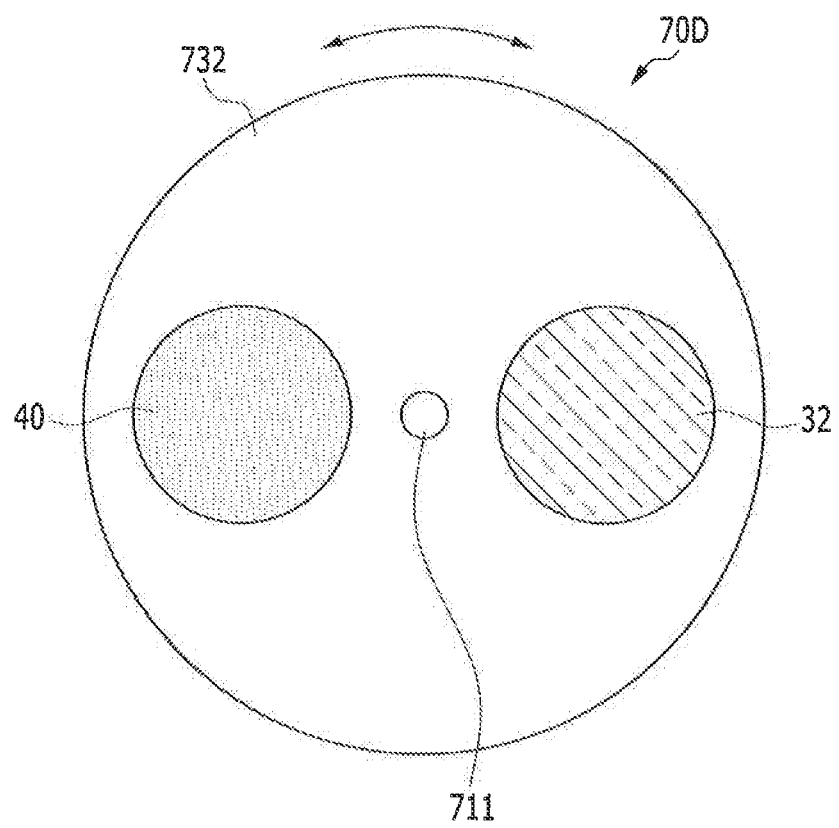

FIG. 8 and FIG. 9 are schematic diagrams of a laser crystallization device according to another exemplary embodiment and FIG. 10A and FIG. 10B are schematic diagrams of a low reflection mirror and a cleaning mirror shown in FIG. 8 and FIG. 9.

Referring to FIG. 8 to FIG. 10B, a laser crystallization device 200 according to another exemplary embodiment has the low reflection mirror 32 and the cleaning mirror 40 combined with a transferor 70D, and one of the low reflection mirror 32 and the cleaning mirror 40 is disposed in the path of the laser beams by operation of the transferor 70D.

According to an embodiment, the transferor 70D includes a driving motor 71 and a mirror frame 732 combined with a rotation shaft 711 of the driving motor 71. The mirror frame 732 is a circular plate, and the rotation shaft 711 is combined with a center of the mirror frame 732. The low reflection mirror 32 and the cleaning mirror 40 are fixed to the mirror frame 732, and are symmetrically disposed with respect to the rotation shaft 711.

According to an embodiment, in a running state, the low reflection mirror 32 is disposed in the path of the laser beams, and the cleaning mirror 40 is moved away from the path of the laser beams. In an idle state, the mirror frame 732 rotates by 180° in a clockwise direction or counterclockwise direction. Therefore, the cleaning mirror 40 is disposed in the path of the laser beams, and the low reflection mirror 32 is moved away from the path of the laser beams.

Figure 11:
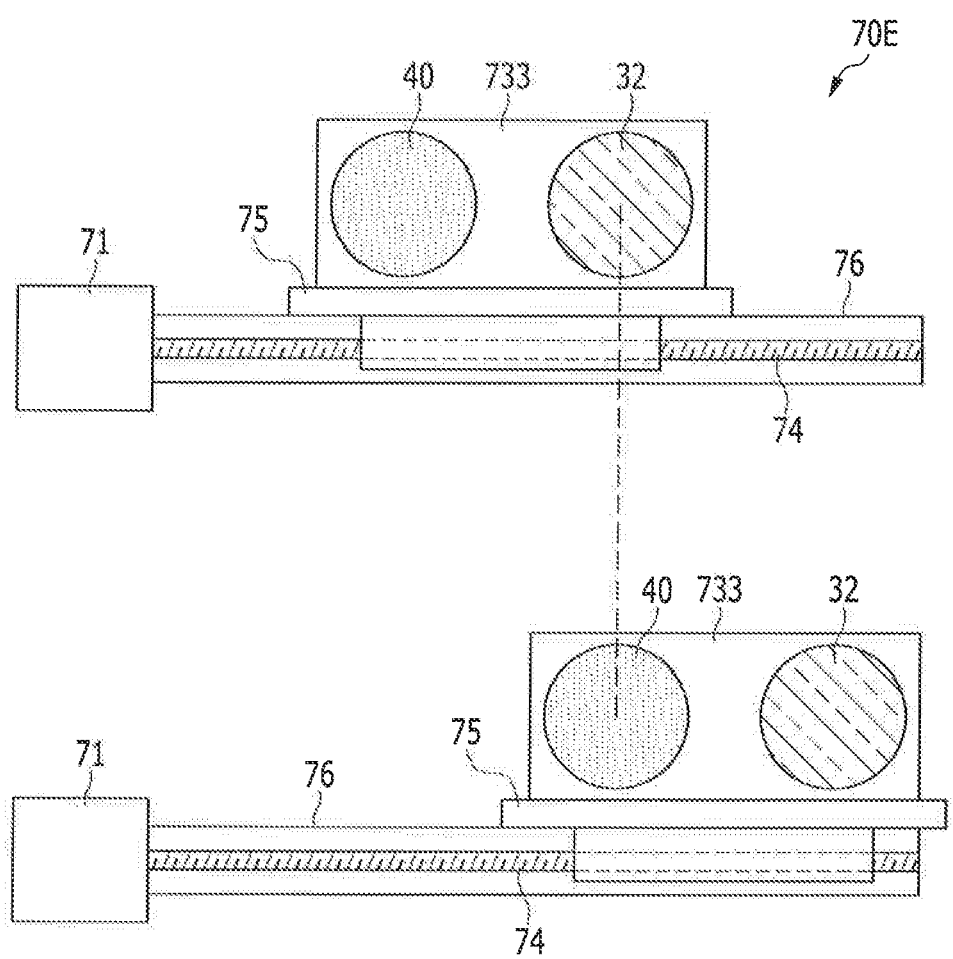
FIG. 11 is a schematic diagram of an exemplary variation of a transferor shown in FIG. 10A and FIG. 10B.

FIG. 11 is a schematic diagram of an exemplary variation of a transferor shown in FIG. 10A and FIG. 10B.

Referring to FIG. 11, according to an embodiment, a transferor 70E includes a driving motor 71 and an LM guide. The LM guide includes a rotation screw 74 combined with the driving motor 71, a slider 75 combined with the rotation screw 74, a mirror frame 733 fixed to the slider 75, and a rail 76 that guides the slider 75. The low reflection mirror 32 and the cleaning mirror 40 are fixed in the mirror frame 733 parallel to the rail 76.

According to an embodiment, when the rotation screw 74 is rotated by the driving motor 71, the slider 75 and the mirror frame 733 move on the rail 76 to move the low reflection mirror 32 and the cleaning mirror 40. In a running state, the low reflection mirror 32 is disposed in the path of the laser beams that have propagated through the second transparent window 12, and the cleaning mirror 40 is moved away from the path of the laser beams. In an idle state, the cleaning mirror 40 is disposed in the path of the laser beams that have propagated through the second transparent window 12, and the low reflection mirror 32 is moved away from the path of the laser beams.

The laser crystallization device 200 according to another exemplary embodiment has a same configuration as an exemplary embodiment described with reference to FIGS. 1-7 except that the low reflection mirror 32 and the cleaning mirror 40 are fixed to a mirror frame to selectively face the second transparent window 12.

Regarding the above-described laser crystallization devices 100 and 200 according to exemplary embodiments, contamination of the second transparent window 12 is reduced by the cleaning mirror 40 and a high transmittance can be maintained for a long duration. Therefore, a replacement period of the second transparent window 12 can be increased and an operational cost of the laser crystallization devices 100 and 200 can be reduced.

Figure 12:
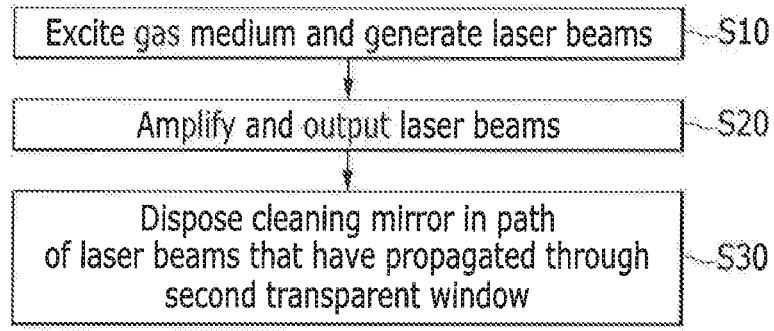
FIG. 12 is a flowchart of a laser crystallization method according to an exemplary embodiment.

FIG. 12 is a flowchart of a laser crystallization method according to an exemplary embodiment.

Referring to FIG. 12, a laser crystallization method according to an embodiment includes a first step S10 of exciting a gas medium in an airtight container to generate laser beams, a second step S20 of transmitting the laser beams through a first transparent window and a second transparent window fixed to respective end portions of the airtight container, amplifying the laser beams using a high reflection mirror and a low reflection mirror, and outputting the amplified laser beams, and a third step S30 of disposing a cleaning mirror in a path of the laser beams that have propagated through the second transparent window.

According to an embodiment, laser beams are generated in the first step S10. A pair of electrodes 20 are disposed in the airtight container 10. One of the pair of electrodes 20 is grounded and the other thereof is connected to the high-voltage power supply 21. In the first step S10, a voltage is applied to the connected electrode 20, and discharging begins in the space between the pair of electrodes 20 that excites the gas medium to generate laser beams.

According to an embodiment, laser beams are output during the second step S20. The high reflection mirror 31 is disposed outside the first transparent window 11 and the low reflection mirror 32 is disposed outside the second transparent window 12. During the second step S20, the laser beams being reflected between the high reflection mirror 31 and the low reflection mirror 32 generate resonance and are amplified, and the amplified laser beams propagate through the low reflection mirror 32 to be output to the irradiation target.

According to an embodiment, the first step 810 and the second step S20 occur substantially simultaneously. The irradiation target is an amorphous silicon layer, and during the second step S20, the amorphous silicon layer is annealed into a polycrystalline silicon layer by irradiation of the laser beams. The second step S20 is the running state in which laser beams are irradiated to the irradiation target.

According to an embodiment, the cleaning mirror is disposed in the third step S30. The third stage S30 is the idle state, that is, a standby state for the next output run, and the second step S20 and the third step S30 are alternately and repeatedly performed.

According to an embodiment, in the third step S30, the cleaning mirror 40 is disposed to face the second transparent window 12. The cleaning mirror 40 is a high reflection mirror with almost 100% reflectivity, and it reflects the laser beams that have propagated through the second transparent window 12 back to the second transparent window 12 to remove the contamination material 80 attached to the internal side of the second transparent window 12.

According to an embodiment, the cleaning mirror 40 is combined with the transferor and can be displaced by the transferor. The cleaning mirror 40 is moved away from and out of the path of the laser beams during the second step S20, and displaced by the transferor to be disposed between the second transparent window 12 and the low reflection mirror 32 in the third step S30. In this case, the transferor may have one of the configurations of FIG. 5, FIG. 6, or FIG. 7.

In other embodiments, the cleaning mirror 40 and the low reflection mirror 32 are combined with the transferor and can be displaced by the transferor. The transferor disposes one of the cleaning mirror 40 or the low reflection mirror 32 in the path of the laser beams.

According to an embodiment, in detail, during the second step S20, the low reflection mirror 32 is disposed in the path of the laser beams, and the cleaning mirror 40 is disposed out of the path of the laser beams. In the third step S30, the transferor exchanges positions of the low reflection mirror 32 and the cleaning mirror 40 so that the cleaning mirror 40 is disposed in the path of the laser beams. The transferor may have one of the configurations of FIG. 10A, FIG. 10B, or FIG. 11.

According to embodiments, the impurities that were absorbed into the second transparent window 12 during the second stage S20 are removed by the laser beams reflected from the cleaning mirror 40 in the third step S30, and the contaminates are removed from the second transparent window 12.

Figure 13:
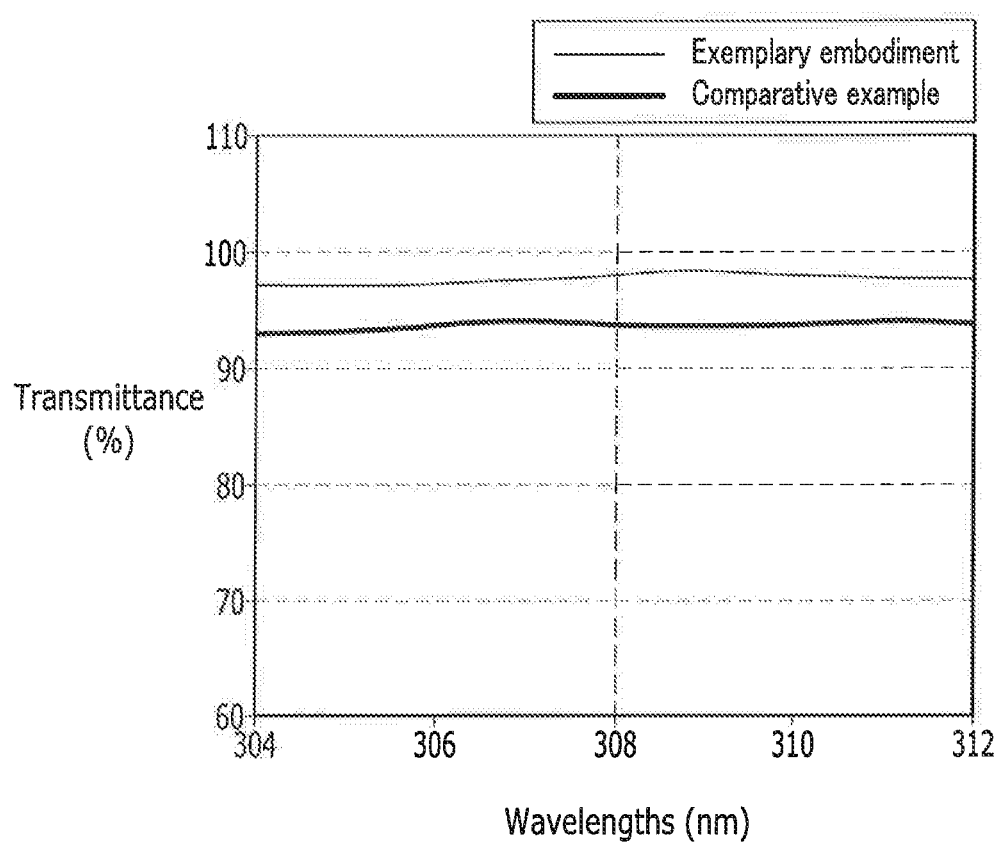
FIG. 13 and FIG. 14 are graphs of transmittance as a function of wavelength of a second transparent window of a laser crystallization device according to a comparative example and a laser crystallization device according to an exemplary embodiment.
Figure 14:
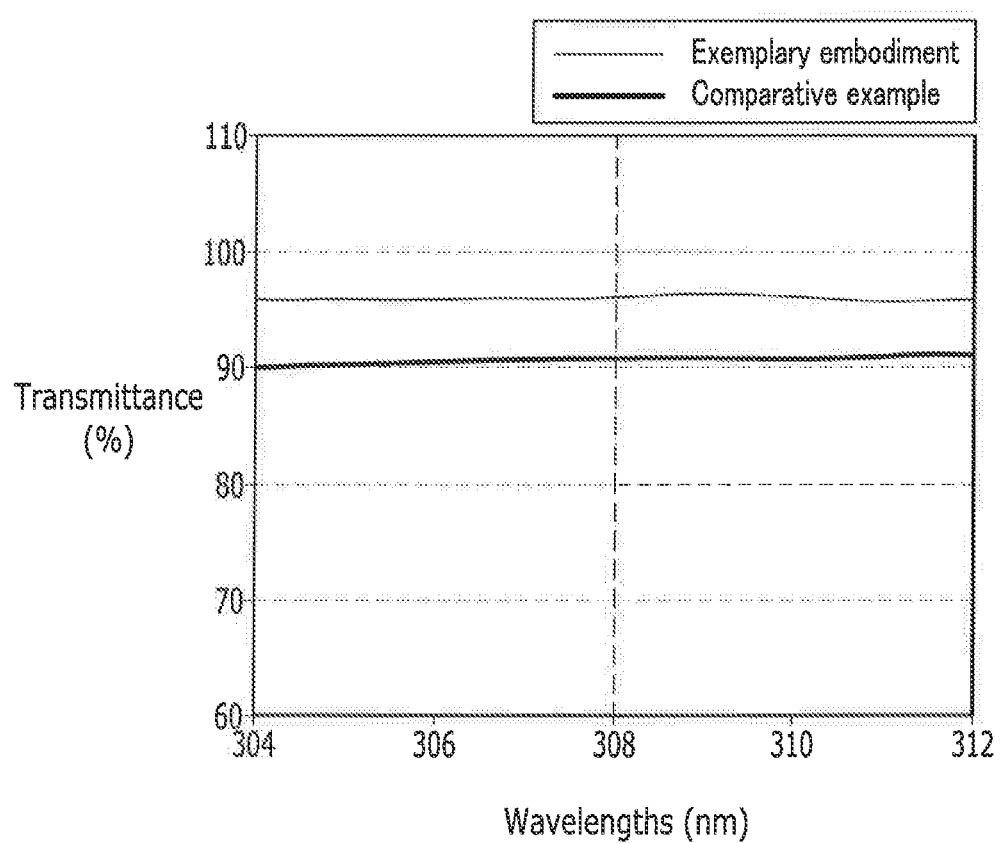
Figure 15:
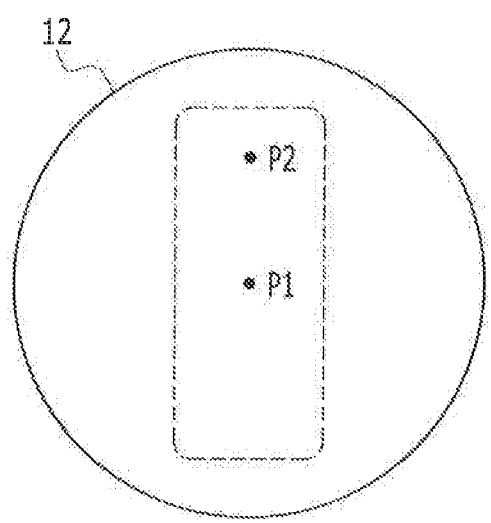
FIG. 15 is a front view of a second transparent window for locating a point for measuring transmittance.

FIG. 13 and FIG. 14 are graphs of transmittance as a function of wavelength of a second transparent window of a laser crystallization device according to a comparative example and a laser crystallization device according to an exemplary embodiment, and FIG. 15 is a front view of a second transparent window for locating a point for measuring transmittance.

FIG. 13 shows a result of measuring transmittance at a center point of a second transparent window, and FIG. 14 shows a result of measuring transmittance at a surrounding point of a second transparent window. In FIG. 15, P1 represents a center point, and P2 represents a surrounding point. The surrounding point P2 is a point halfway between the center point P1 and an edge of the second transparent window 12, and a dotted line outlines a region in the second transparent window 12 through which laser beams are actually transmitted.

The comparative example is a case when the cleaning mirror is not used, and in both the comparative example and an exemplary embodiment, transmittance of the second transparent window is measured after irradiation of forty million shots. Output characteristics of the laser beams of the comparative example and an exemplary embodiment are 1.6 kV and 200 Hz.

Referring to FIG. 13, transmittance of a 308 nm wavelength laser beam through the second transparent window is 90.7% in the comparative example, and is 96.1% in an exemplary embodiment. Referring to FIG. 14, transmittance of the 308 nm wavelength laser beam through the second transparent window is 93.7% in the comparative example, and is 98.0% in the exemplary embodiment. An exemplary embodiment that uses a cleaning mirror has a 5% transmittance improvement as compared to the comparative example.

While embodiments of this disclosure have been described in connection with what is presently considered to be practical exemplary embodiments, it is to be understood that embodiments of the disclosure are not limited to the disclosed exemplary embodiments, but, on the contrary, are intended to cover various modifications and equivalent arrangements included within the spirit and scope of the appended claims.

What is claimed is:

1. A laser crystallization method, comprising:
exciting a gas medium in an airtight container wherein laser beams are generated;
amplifying the laser beams by reflecting the laser beams between a first high reflection mirror and a low reflection mirror respectively disposed facing opposite end portions of the airtight container, wherein a first transparent window and a second transparent window are fixed to respective end portions of the airtight container; and
outputting the amplified laser beams through the second transparent window and the low reflection mirror, wherein the amplified laser beams are irradiated onto a target; and
disposing a second high reflection mirror in a path of the laser beams that have propagated through the second transparent window, wherein the laser beams are reflected back into the airtight container through the second transparent window,
wherein the second high reflection mirror is moved away from the path of laser beams during the outputting of the amplified laser beams,
wherein the low reflection mirror and the second high reflection mirror are combined with a driving means that is configured to dispose the second high reflection mirror in the path of the laser beams and to move the second high reflection mirror away from the path of the laser beams.

2. The laser crystallization method of claim 1, wherein outputting the amplified laser beams is a running state wherein the laser beams are irradiated to an irradiation target, and
disposing the second high reflection mirror is an idle state of waiting for a next output run.

3. The laser crystallization method of claim 1, wherein the driving means displaces the second high reflection mirror between a first position in the path of the laser beams and a second position away from and out of the path of the laser beams.

4. The laser crystallization method of claim 3, wherein
The driving means includes a driving motor and a mirror frame that is rotated by the driving motor and that fixes the second high reflection mirror, and
the second high reflection mirror is displaced between the first position and the second position by rotation of the mirror frame.

5. The laser crystallization method of claim 3, wherein
The driving means includes a driving motor and a mirror frame that is linearly displaced by the driving motor and that fixes the second high reflection mirror, and the second high reflection mirror is displaced between the first position and the second position by linear motion of the mirror frame.

6. The laser crystallization method of claim 1, wherein the driving means exchanges positions of the low reflection mirror and the second high reflection mirror between outputting the amplified laser beams and disposing the second high reflection mirror.

7. The laser crystallization method of claim 6, wherein the driving means includes a driving motor and a mirror frame that is rotated by the driving motor and that fixes the low reflection mirror and the second high reflection mirror, and the positions of the low reflection mirror and the second high reflection mirror are exchanged by rotating the mirror frame.

8. The laser crystallization method of claim 1, wherein the low reflection mirror is moved away from the path of laser beams when disposing the second high reflection mirror.

9. The laser crystallization method of claim 8, wherein the driving means includes a driving motor and a mirror frame that is linearly translated by the driving motor and that fixes the low reflection mirror and the second high reflection mirror, and one of the low reflection mirror and the second high reflection mirror is disposed to face the second transparent window by linear translation of the mirror frame.

10. A laser crystallization device, comprising:
an airtight container that is a gas laser device charged with a gas medium,
a first transparent window and a second transparent window fixed to respective end portions of the airtight container that face each other along a center axis of the airtight container;
a first high reflection mirror installed outside the first transparent window and a low reflection mirror installed outside the second transparent window, wherein the low reflection mirror has a reflectivity that is lower than its transmittance;
a second high reflection mirror; and
a driving means that includes a driving motor and a mirror frame and that is combined with the low reflection mirror and the second high reflection mirror, wherein
during a running state, laser beams are output from the airtight container through the second transparent window and the low reflection mirror to an irradiation target, and the second high reflection mirror is positioned by the driving means away from and out of a path of laser beams output from the airtight container, and
during an idle state, the second high reflection mirror is disposed by the driving means in the path of the laser beams output from the airtight container, wherein the laser beams are reflected back into the airtight container through the second transparent window.

11. The laser crystallization device of claim 10, further comprising a shutter that transmits laser beams propagating through the low reflection mirror in the running state, and blocks laser beams propagating through the low reflection mirror in the running state, and blocks in the idle state.

12. The laser crystallization device of claim 10, wherein one of the low reflection mirror and the second high reflection mirror is disposed in the path of the laser beams by operation of the driving motor.

13. The laser crystallization device of claim 12, wherein the mirror frame is rotated by the driving motor and that fixes the low reflection mirror and the second high reflection mirror, and the positions of the low reflection mirror and the second high reflection mirror are exchanged by rotating the mirror frame.

14. The laser crystallization device of claim 12, wherein the mirror frame is linearly translated by the driving motor and that fixes the low reflection mirror and the second high reflection mirror, and one of the low reflection mirror and the second high reflection mirror is disposed to face the second transparent window by linear translation of the mirror frame.

15. The laser crystallization device of claim 10, wherein the driving means displaces the second high reflection mirror between a first position in the path of the laser beams and a second position away from and out of the path of the laser beams.

16. The laser crystallization device of claim 15, wherein the mirror frame is rotated by the driving motor and that fixes the second high reflection mirror, and the second high reflection mirror is displaced between the first position and the second position by rotation of the mirror frame.

17. The laser crystallization device of claim 15, wherein the mirror frame is linearly displaced by the driving motor and that fixes the second high reflection mirror, and the second high reflection mirror is displaced between the first position and the second position by linear motion of the mirror frame.

18. The laser crystallization device of claim 10, wherein the laser beams reflected back into the airtight container remove contamination material attached to an internal side of the second transparent window.

19. The laser crystallization device of claim 10, further comprising:
a pair of electrodes symmetrically disposed with respect to the center axis of the airtight container, wherein when a voltage is applied to the electrodes, the gas medium is excited to generate laser beams;
a high-voltage power supply connected to one of the pair of electrodes;
a reflection mirror that changes a propagation direction of the laser beams; and
a condensing lens that condenses the laser beams to the irradiation target.

* * * * *